United States Patent [19]
Yoshimi et al.

[11] Patent Number: 5,100,810
[45] Date of Patent: Mar. 31, 1992

[54] MANUFACTURING METHOD OF SEMICONDUCTOR DEVICES

[75] Inventors: Makoto Yoshimi, Tokyo; Minoru Takahashi, Yokohama, both of Japan

[73] Assignee: Kabushiki Kaisha Toshiba, Kawasaki, Japan

[21] Appl. No.: 738,443

[22] Filed: Jul. 31, 1991

[30] Foreign Application Priority Data

Aug. 9, 1990 [JP] Japan ................................. 2-209339

[51] Int. Cl.$^5$ .................. H01L 21/265; H01L 21/86; H01L 29/70
[52] U.S. Cl. ........................................ 437/21; 437/32; 437/35; 437/59; 148/DIG. 150
[58] Field of Search ............................. 437/21, 32, 35; 148/150; 439/59, 31 3 (U.S. only)

[56] References Cited

U.S. PATENT DOCUMENTS 4,199,773  4/1980  Goodman et al. .................... 437/21
4,965,872  10/1990  Vasuder ................................ 357/35

OTHER PUBLICATIONS

IEEE, EDL-8, No, 3, p. 104, 1987; J. C. Sturm et al.; Mar., 1987, "A Lateral Silicon-On-Insulator Bipolar Transistor with a Self-Aligned Base Contact".

*Primary Examiner*—Olik Chaudhuri
*Assistant Examiner*—Long Pham
*Attorney, Agent, or Firm*—Oblon, Spivak McClelland, Maier & Neustadt

[57] ABSTRACT

On the surface of an insulating substrate, a semi-conductor layer composed of a semiconductor layer of a first conductivity type on which a high-concentration semiconductor layer of the first conductivity type is formed. By selectively etching the semiconductor layer, the high-concentration external base region of the first conductivity is left, and at the same time, only a thicker prospective internal base region just under the external base region and a prospective emitter region and prospective collector region, which are located on both sides of the prospective internal base region and have steps between themselves and the prospective internal base region, are left to form island regions. A sidewall insulating film is formed which covers at least the sidewalls on the prospective collector region side among sidewalls of the external base region and sidewalls at the steps of the prospective internal base region adjoining the sidewalls of the external base region. The emitter region and collector region of the second conductivity type are formed by ion implantation perpendicular to the substrate with the insulating film covering the external base region and the sidewall insulating film as blocking mask.

8 Claims, 10 Drawing Sheets

MANUFACTURING METHOD OF SEMICONDUCTOR DEVICES

BACKGROUND OF THE INVENTION

1. Field of the Invention

This invention relates to a manufacturing method of semiconductor devices, and more particularly to a manufacturing method of semiconductor devices having lateral bipolar transistors with an SOI (Silicon on Insulator) structure, which are hereinafter referred to as BIP elements.

2. Description of the Related Art

Since lateral BIP elements formed on SOI films have a low stray capacity, they are expected to operate faster than those formed on bulk silicon substrates. Examples of such elements are disclosed in an article by J.C. Sturm et al., IEEE, EDL-8, No. 3, p. 103, 1987. A manufacturing sequence of a conventional BIP element of this type is shown in FIGS. 1A through 1D.

Figure 1A:
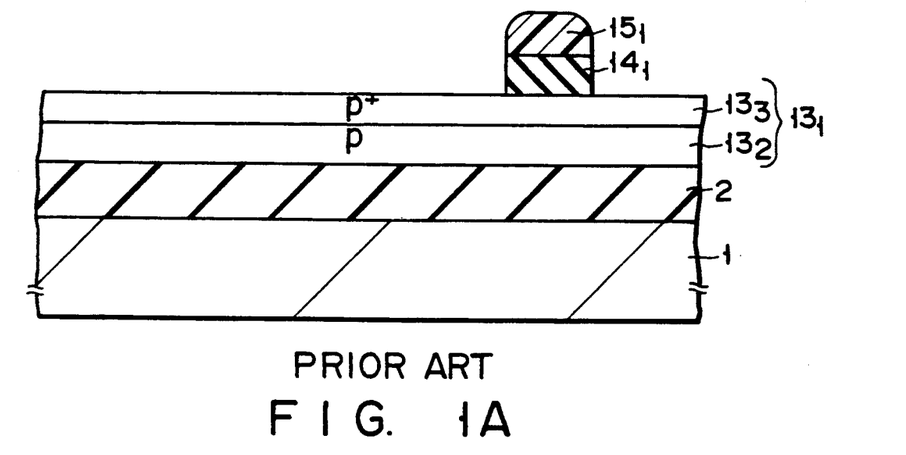
FIGS. 1A through 1D are sectional views each illustrating the individual processes in a conventional manufacturing method of BIP elements.

First, an $SiO_2$ film 2 and a p-type SOI film $13_1$ are formed on an Si substrate 1. The p-type SOI film surface undergoes the implantation of boron ions and annealing to convert the surface layer of the p-type SOI film $13_1$ into a p-type high-concentration impurity layer ($p^+$-type layer). In this way, the p-type impurity layer (p-type layer)$13_2$ and $p^+$-type layer $13_3$ are formed. After a CVD oxide film is deposited on the $p^+$-type layer $13_3$ to form a resist film pattern $15_1$ that covers a predetermined region of the CVD oxide film, with the resist film pattern $15_1$ as mask, the CVD oxide film is selectively etched to form a CVD oxide film pattern $14_1$. (FIG. 1A)

Figure 1B:
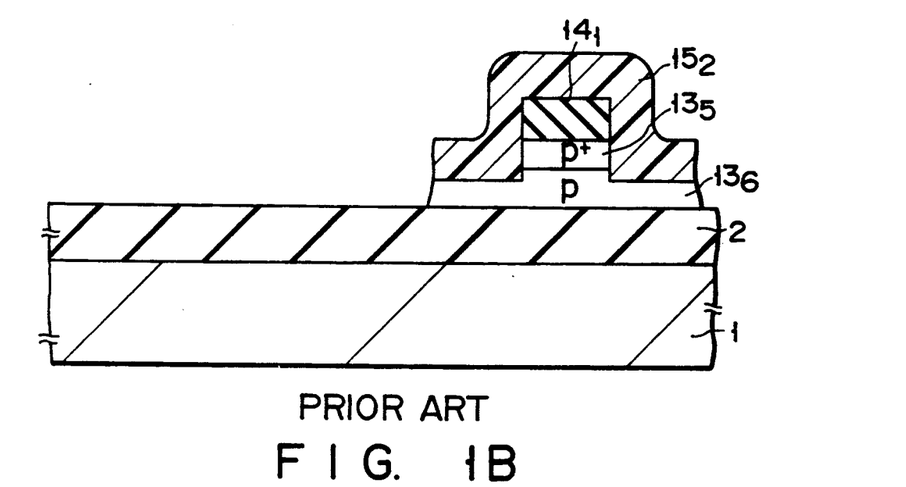

Then, with the resist film pattern $15_1$ as mask, the exposed $p^+$-type layer $13_3$ is etched to form a $p^+$-type region $13^5$. The p-type layer $13_2$ is also partly etched in the direction of thickness. After the resist film $15_1$ is removed, another resist pattern $15_2$ is formed on the CVD oxide film pattern $14_1$ and a predetermined region of the p-type layer $13_2$. By using the resist pattern $15_2$ as mask, the p-type layer $13_2$ undergoes selective etching to form an island p-type region $13_6$. (FIG. 1B)

Figure 1C:
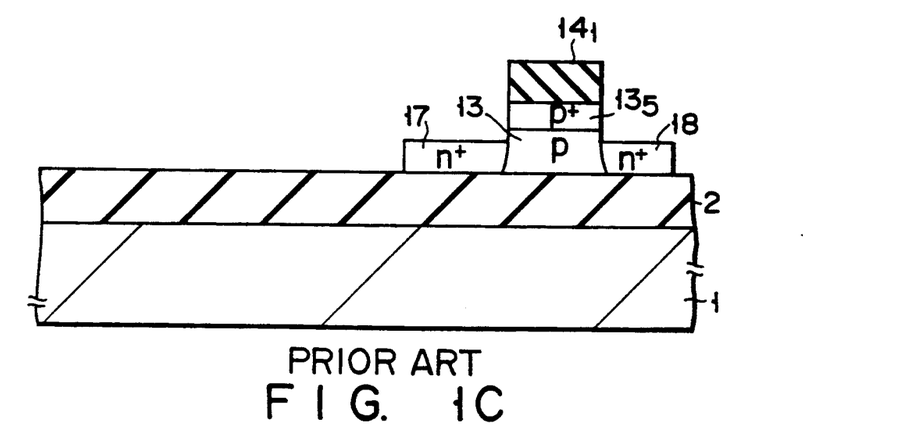

After the resist pattern $15_2$ is removed, by using the CVD oxide film pattern $14_1$ as blocking mask, the p-type region $13_6$ undergoes the ion implantation of n-type impurities such as arsenic ion and annealing, which forms an n-type high-concentration impurity region (hereinafter, referred to as an $n^+$-type region) 17, an $n^+$-type region 18, and a p-type region 13 that is the remaining portion of the p-type region $13_6$. (FIG. 1C)

Figure 1D:
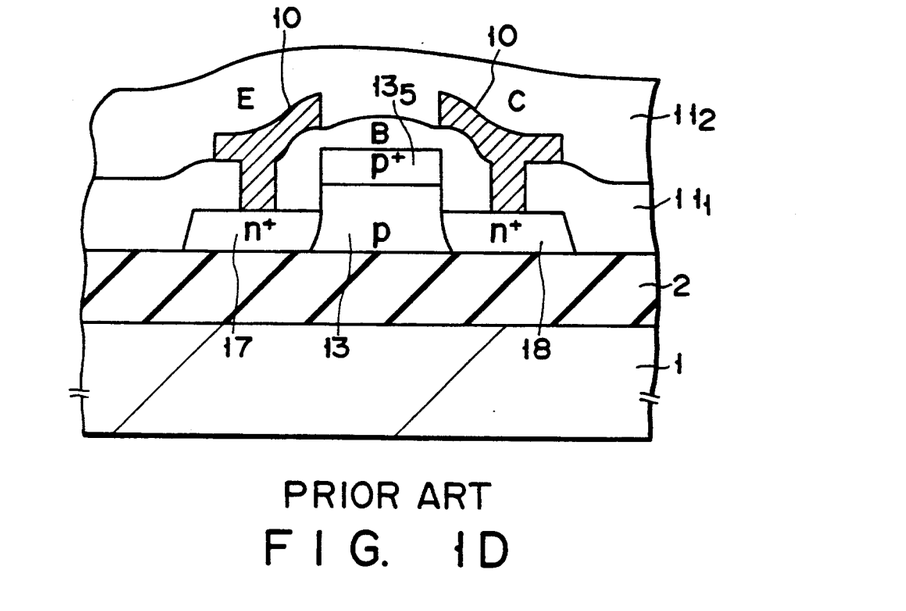

After an interlayer insulating film 111 is deposited and necessary contact holes are made therethrough, interconnections 10 are formed which each make ohmic contact with the individual impurity regions. Then, a passivation film $11_2$ is formed to complete an n-p-n lateral BIP element. Here, the emitter portion is indicated by E, the base portion by B, and the collector portion by C. In the BIP element, the p-type region 13 is an internal base region and the $p^+$-type region 135 is an external base region. An $n^+$-type region 17 that meets the left side of the internal base region 13 is the emitter region and an $n^+$-type region 18 that meets the right side of the internal base region 13 is the collector region. (FIG. 1D)

The SOI lateral BIP element produced by the aforementioned method, however, does not provide high performance as expected because of the following problems: first, the withstand voltage decreases significantly, and second, the long transit time of carriers in the base region impairs the high-frequency characteristics, such as cut-off frequency.

Figure 2:
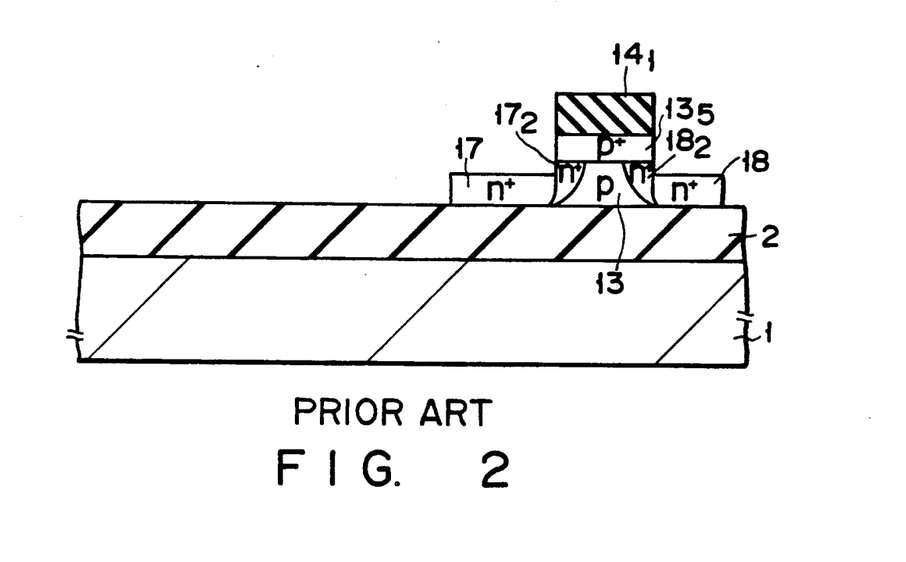
FIG. 2 is a sectional view of a typical BIP element produced by a conventional method.

The cause of the decreased withstand voltage lies in the fact that a high electric field is apt to develop at the junction between the base region and the collector region. More specifically, when ion implantation is performed on the p-type region $13_6$, the sidewalls of the $p^+$-type region $13_5$ and p-type region $13_6$ are also liable to be affected by doping of the n-type impurities. This also forms the highly doped $n^+$-type regions $17_2$ and $18_2$ on the sidewalls as shown in FIG. 2, which creates a highly doped p-n junction with respect to the external base region $13_5$. With the base-collector junction applied with the reverse bias, formation of such a highly doped p-n junction decreases the base-collector withstand voltage.

The long transit time of carriers in the base region is ascribed to the uniformity of the impurity concentration profile parallel with the substrate surface in the base region, which results in the poor transport factor of carriers in the base region. The poor transport factor results from the fact that with the above-described method, it is impossible to give a desired impurity concentration profile to the p-type region 13 of the base region because of its structure.

SUMMARY OF THE INVENTION

A major object of the present invention is to provide a manufacturing method of semiconductor devices with which lateral BIP elements can be formed which not only operate very fast with a short transit time of carriers in the base region, but also have an excellent base-collector withstand voltage.

Another object of the present invention is to provide a method that enables BIP elements with the foregoing excellent characteristics and insulated-gate field-effect transistors such as MOSFETs to be formed on the same substrate with good compatibility.

The foregoing major object is accomplished by a manufacturing method comprising: a first step of forming on the surface of an insulating substrate a semiconductor layer composed of a semiconductor layer of a first conductivity type on which a high-concentration semiconductor layer of the first conductivity type is formed; a second step of forming an insulating film pattern that covers a prospective external base region of the high-concentration semiconductor layer of the first conductivity; a third step of leaving the high-concentration external base region of the first conductivity type just under the insulating film pattern by selectively etching the high-concentration semiconductor layer of the first conductivity type over the entire film thickness and then selectively etching the semiconductor layer of the first conductivity type over part of the film thickness with the insulating film pattern as mask, and at the same time, forming a thicker prospective internal base region just under the external base region and thinner portions on both side of the prospective internal base region; a fourth step of forming an island element region by leaving only a prospective emitter region and prospective collector region that are located on both sides of the prospective internal base region and have steps between these prospective emitter and collector regions and the prospective internal base region through selective etching of the thinner portions of the semiconductor layer of the first conductivity type; a fifth step of forming a sidewall insulating film that covers at least the sidewalls on the prospective collector region side among sidewalls of the external base region and sidewalls at the steps of the prospective internal base region adjoining the sidewalls of the external base region; and a sixth step of forming the emitter region and collector region of a second conductivity type in the prospective emitter region and collector region, respectively, and the internal base region of the first conductivity type between the emitter and collector regions by highly doping impurities of the second conductivity type into the island element regions through ion implantation perpendicular to the substrate with the insulating film pattern covering the external base region and the sidewall insulating film as blocking mask.

The other object is accomplished by a manufacturing method comprising: a first step of forming on the surface of an insulating substrate a semiconductor layer composed of a semiconductor layer of a first conductivity type on which a high-concentration semiconductor layer of the first conductivity type is formed; a second step of forming an insulating film pattern that covers a prospective external base region of the high-concentration semiconductor layer of the first conductivity; a third step of leaving the high-concentration external base region of the first conductivity type just under the insulating film pattern by selectively etching the high-concentration semiconductor layer of the first conductivity type over the entire film thickness and then selectively etching the semiconductor layer of the first conductivity type over part of the film thickness with the insulating film pattern as mask, and at the same time, forming a thicker prospective internal base region just under the external base region and thinner portions on both sides of the prospective internal base region; a fourth step of forming a first island element region for a BIP element by leaving a prospective emitter region and prospective collector region that are located on both sides of the prospective internal base region and have steps between these prospective emitter and collector regions and the prospective internal base region through selective etching of the thinner portions of the semiconductor layer of the first conductivity type, and at the same time, forming a second island element region for an insulated-gate field effect transistor; a fifth step of forming a gate electrode via a gate insulating film on a prospective channel-forming region in the second island element region for an insulated-gate field effect transistor; a sixth step of forming a first sidewall insulating film that covers at least the sidewalls on the prospective collector region side among sidewalls of the external base region and sidewalls at the steps of the prospective internal base region adjoining the sidewalls of the external base region, and at the same time, forming a second sidewall insulating film covering sidewalls of the gate electrode; and a seventh step of forming the emitter region and collector region of a second conductivity type in the prospective emitter region and collector region, respectively, and the internal base region of the first conductivity type between the emitter and collector regions and at the same time, forming a channel-forming region of the first conductivity type just under the gate electrode in the second island element region, and also forming the source region and drain region of the second conductivity type separated from each other on both sides of the channel-forming region, by highly doping impurities of the second conductivity type into the first and second island element regions through ion implantation perpendicular to the substrate with the insulating film pattern covering the external base region, the gate electrode, and the first and second sidewall insulating films as blocking mask.

In those manufacturing methods, field-effect transistors are formed simultaneously together with the lateral BIP transistors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of a manufacturing method according to the present invention will be explained, referring to FIGS. 3A through 3G, FIG. 4 and FIG. 5. The embodiment relates to the method of simultaneously manufacturing n-p-n BIP elements and MOS field-effect transistors (MOSFETs), or a manufacturing method of BiCMOS's.

Figure 3A:
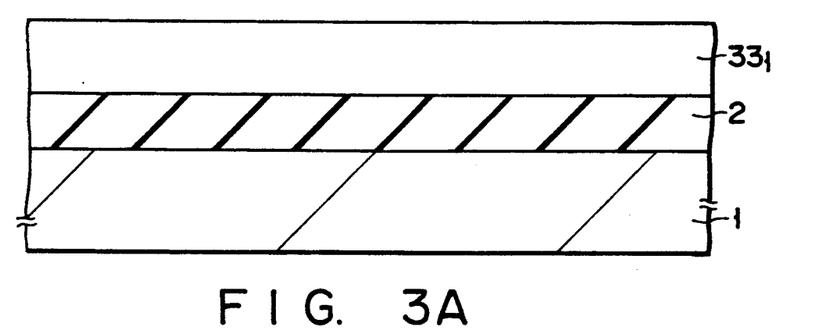
FIGS. 3A through 3G are sectional views each illustrating the individual processes in a manufacturing method of semiconductor devices according to the present invention.

First, oxygen ions are implanted into a p-type single-crystal Si substrate 1 at an acceleration voltage of 180 kV at a dose of $2 \times 10^{18} cm^{-2}$ to dope oxygen a specified thickness of the Si substrate 1. Annealing is then performed at 1300° C. for 20 hours to cause the doped oxygen to react with silicon to form a 4000Å of $SiO_2$ layer 2, on which an SOI film $33_1$ of a thickness of 2500Å is left. In this way, what is called an SOI substrate is obtained. (FIG. 3A).

Although in the embodiment, an Si substrate is used as semiconductor substrate, other IV-group semiconductors, such as Ge and C and compound semiconductors, such as SiGe, GaAs, and InP may be used.

An SOI substrate of the same structure as described above may be formed by the following method: a CVD—$SiO_2$ layer 2 is formed on the Si substrate 1; then after polysilicon is deposited on the $SiO_2$ layer 2, the polysilicon layer is converted into a single crystal layer in liquid or solid phase to form an SOI film $33_1$. In this case, instead of the Si substrate 1, an insulating single crystal substrate such as sapphire or spinel may be used.

Figure 3B:
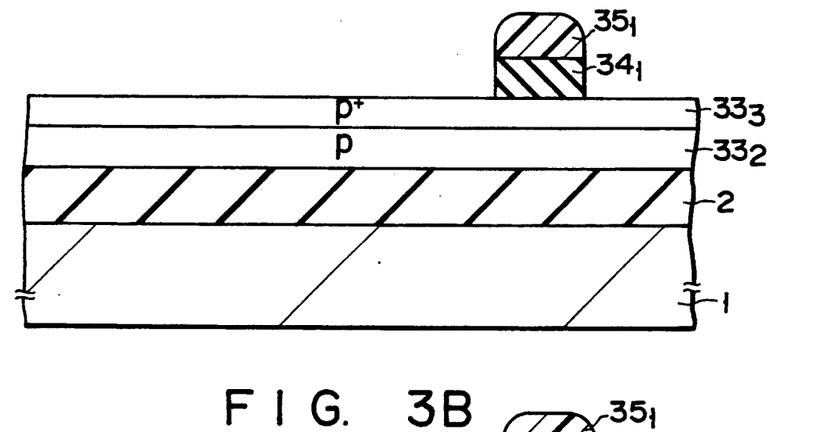

Then, after boron ions are implanted in the SOI film $33_1$ at an acceleration voltage of 50 kV at a dose of $2\times10^{11}cm^{-2}$, annealing is performed for two hours to convert the entire SOI film $33_1$ into a p-type region $33_2$ with an impurity concentration of approximately $10^{17}cm^{-3}$. Additionally, after boron ions are implanted at an acceleration voltage of 30 kV at a dose of $3\times10^{15}cm^{-2}$, annealing is performed for two hours to form a p+-type region 333 at the surface of the p-type region $33_2$. Then, after a CVD oxide film with a thickness of 4000Å is formed on the p+-type region $33_3$, a resist film pattern 35 is formed on a prospective base region of a BIP element. With the resist film pattern 35, as etching resistant mask, the CVD oxide film is selectively etched by reactive ion etching techniques to leave an oxide film pattern $34_1$. (FIG. 3B)

Figure 3C:
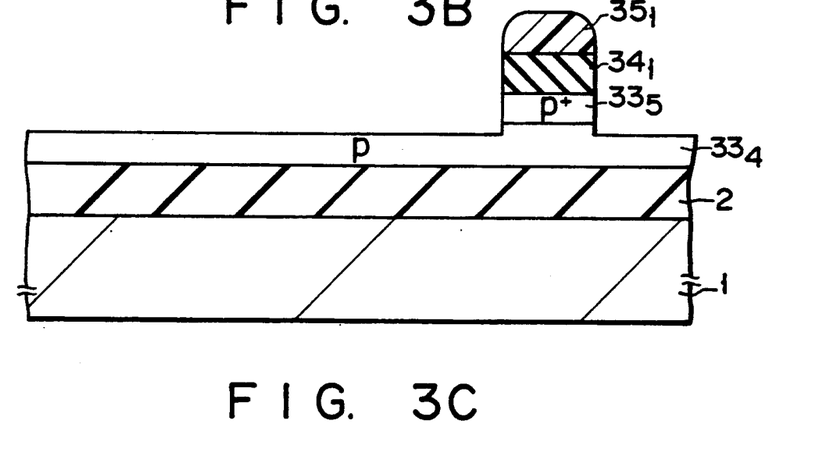

Next, of the p+-type region $33_3$, only the region just under the oxide film pattern $34_1$ is left by selective etching to form a p+-type external base region $33_5$. At the same time, the surface layer of the p-type region $33_2$ is also etched away to leave a p-type region $33_4$ with a thickness of 1000Å. (FIG. 3C)

Figure 3D:
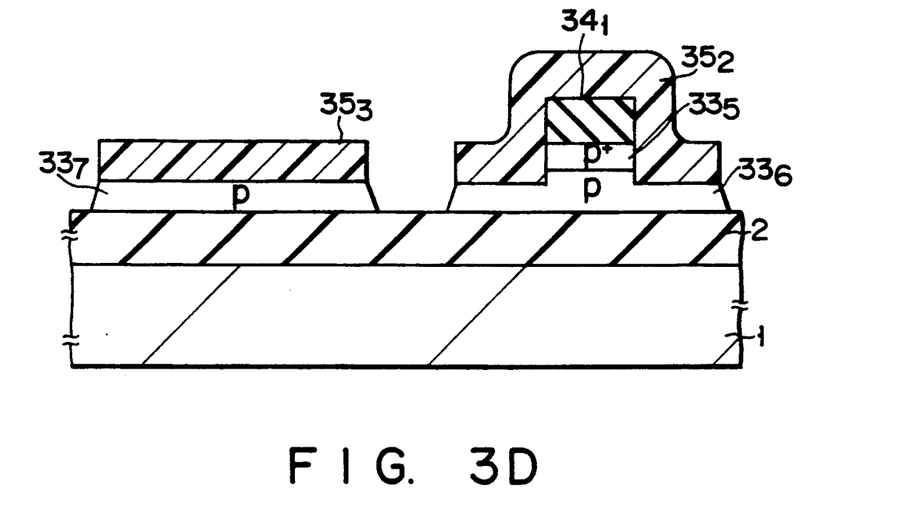

After this, the resist film pattern $35_1$ is removed and resist film patterns $35_2$ and $35_3$ are newly formed. The resist film pattern $35_2$ covers the oxide film pattern $34_1$ and p+-type external base region $33_5$ as well as the p-type region $33_4$ at the portion just under the external base region, i.e. a prospective internal base region, and at the specified portions on both sides of the prospective internal base region, i.e. a prospective emitter region and prospective collector region. The resist film pattern $35_3$ covers the predetermined region in which a MOSFET is to formed. With these resist film patterns $35_2$ and $35_3$ as mask, selective etching is performed to form island element regions $33_6$ and $33_7$. The island element region $33_6$ corresponds to a BIP element portion and the island element region $33_7$ to a MOS element portion. (FIG. 3D)

Figure 3E:
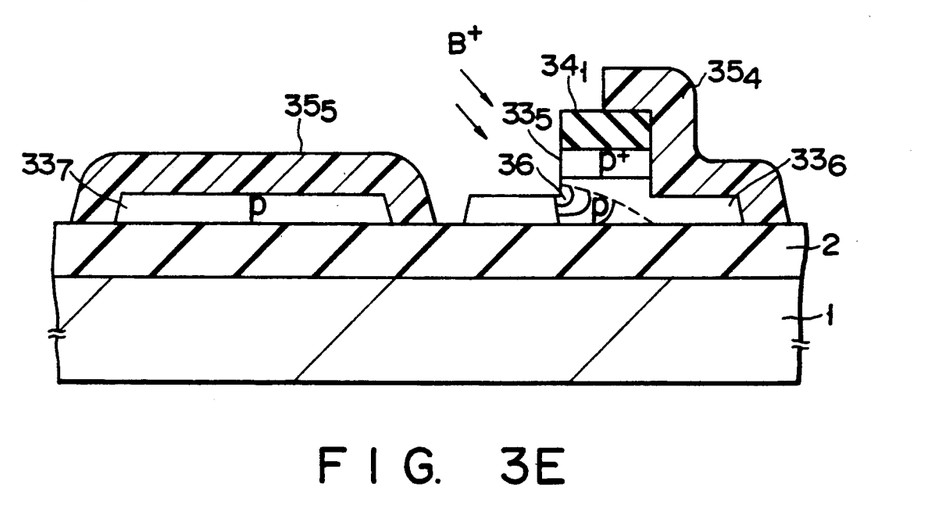

Then, after the resist film patterns $35_2$ and $35_3$ are removed, the prospective collector region side of the BIP element portion is covered with a resist film $35_4$ and the MOS element portion is covered with a resist film $35_5$. By using these resist films as blocking mask, boron ions are diagonally implanted in the substrate, for example, at a tilt angle of 45° to the substrate, at an acceleration voltage of 50 kV at a dose of $1\times10^{13}cm^{-2}$ to form an ion implantation layer 36 just under the external base region $33_5$ in the island element region $33_6$. The implantation angle must be adjusted so as not to cause channeling due to implantedions. It is desirable to implant ions at angles ranging from 20° to 80° with respect to the substrate surface. In this case, by rotating the Si substrate 1 during ion implantation, ions may be implanted into the BIP element portion arranged in various directions. (FIG. 3E)

Figure 3F:
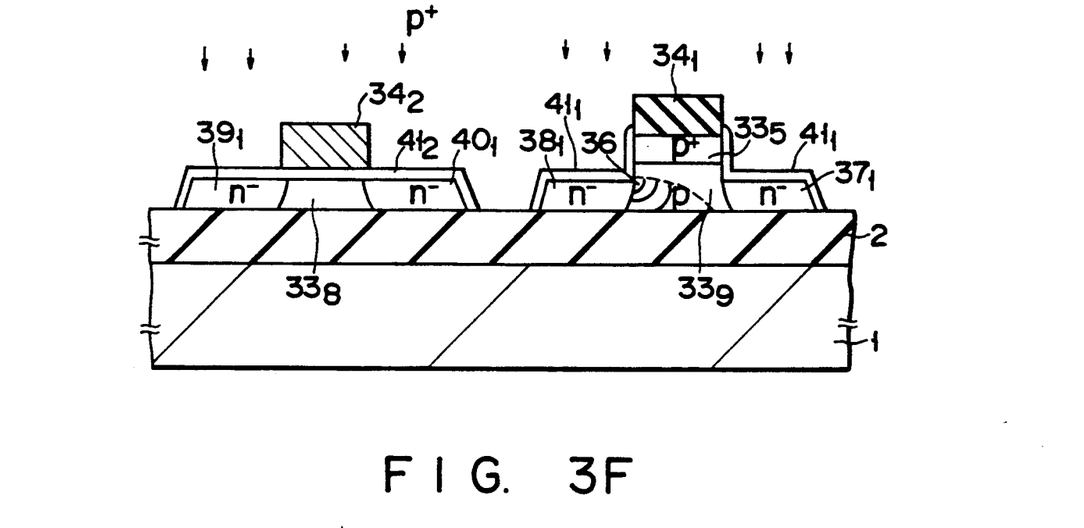

Next, oxide films $41_1$ and $41_2$ are formed at the BIP element portion and MOS element portion, respectively. Then, after the deposition of boron-doped polysilicon film, patterning is made to form a gate electrode $34_2$ on the specified region of the island element region $33_7$ for the MOSFET. Following this, phosphorus ions are almost vertically implanted into the substrate 1 at an acceleration voltage of 50 kV at a dose of $1\times10^{13}cm^{-2}$. This forms a p-type internal base region $33_9$ having the ion implantation layer 36 just under the external base region $33_5$ and n−-type regions $37_1$ and $38_1$ on both sides of the internal base region $33_9$ in the BIP element portion. At the same time, in the MOS element portion, a channel-forming region $33_8$ is formed below the gate electrode $34_2$ and n-type low-concentration diffused layers (n−-type regions) $39_1$ and $40_1$ are formed on both sides the channel-forming region $33_8$. (FIG. 3F)

Figure 3G:
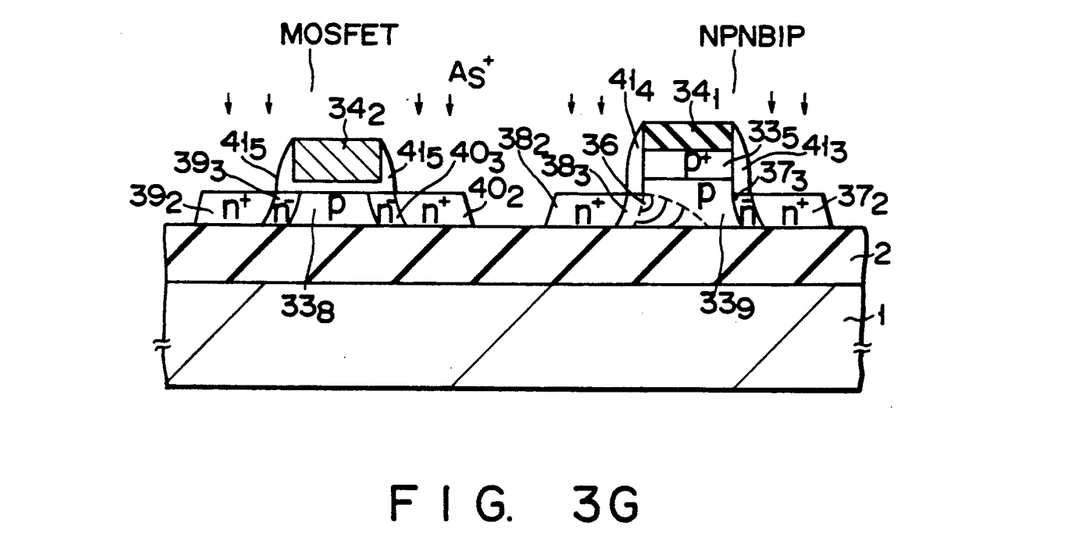

Then, on the surfaces of the BIP element portion and the MOS element portion, a $CVDSiO_2$ film is formed to a thickness of 2000Å. After this, by performing reactive ion etching on the $SiO_2$ film, sidewall $SiO_2$ films $41_3$ and $41_4$ are formed on the sidewalls of the external base region $33_5$ and the sidewalls at the step portions the internal base region $33_9$ adjoining the sidewalls of the external base region $33_5$, and at the same time, a sidewall $SiO_2$ film $41_5$ is also formed on the sidewalls of the gate electrode in the MOS element portion. Arsenic ions are then vertically implanted into the substrate 1, at an acceleration voltage of 60 kV at a dose of $3\times10^{16}cm^{-2}$, followed by an hour of annealing at 900° C. During the ion implantation, the oxide film pattern $34_1$, gate electrode $34_2$, and sidewall $SiO_2$ films $41_3$, $41_4$, and $41_5$ function as blocking mask.

In this way, in the BIP element portion, an n+-type collector region $37_2$ and emitter region $38_2$ are formed on both sides of the internal base region $33_9$, which is separated from the former by thin n−-type region $37_3$ and $38_3$. It is preferable, however, that the thin n−-type region $38_3$ is also converted to p-type region by B+-ion implantation for foming the ion implantation layer 36, in view of enhancing emitter injection efficiency. In the MOS element portion, an n+-type source region $39_2$ and drain region $40_2$ are formed on both sides of the channel-forming region $33_8$, which is separated from the former by thin n−-type regions $39_3$ and $40_3$. That is, in the MOS element portion, a LDD (Lightly-Doped-Drain) region intervenes between the channel-forming region and drain region. (FIG. 3G)

Next, after deposition of a CVDSiO film $42_1$ as inter layer insulating film or a BPSG film, aluminum interconnection 50 are made in a known manner and finally a passivating PSG film $42_2$ is deposited. This completes the lateral BIP element and MOSFET having the planar structure of FIG. 4 and the sectional structure of FIG. 5A (the sectional structure taken along line a—a' of FIG. 4). FIG. 5B is a sectional view taken along line b—b' of FIG. 4 and FIG. 5C is a sectional view taken along line c—c' of FIG. 4.

Figure 4:
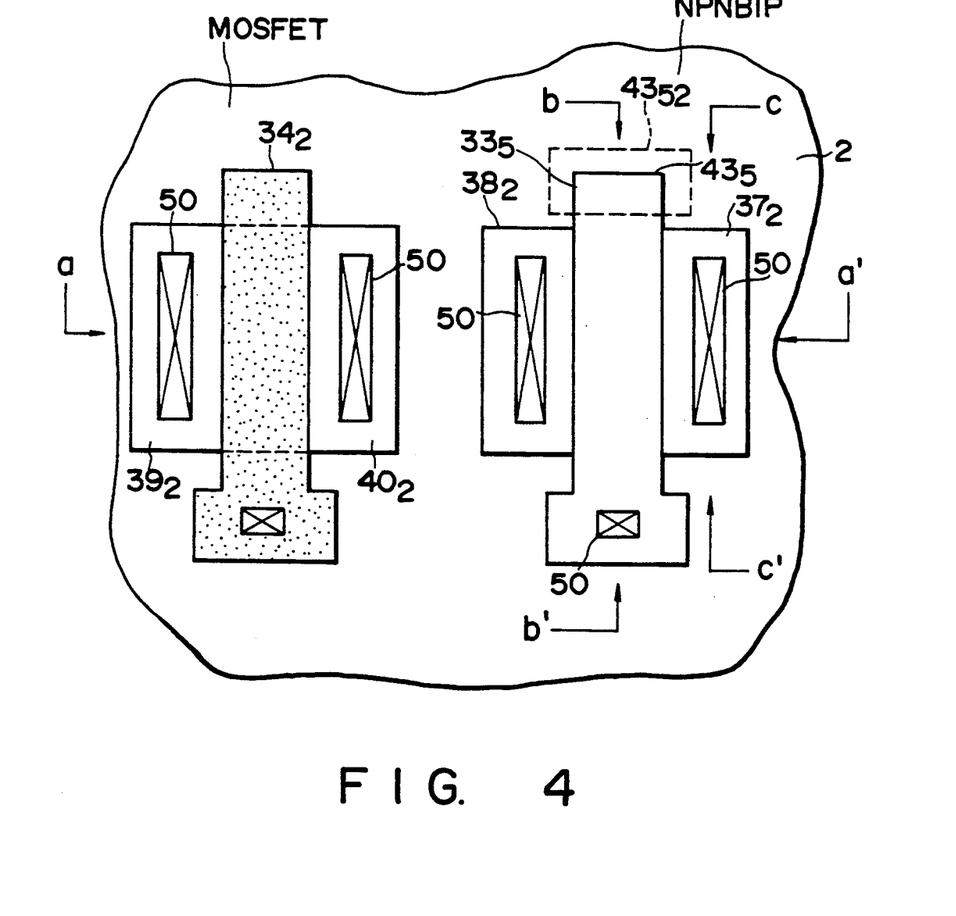
FIG. 4 is a plan view of a semiconductor device produced by a method according to the present invention.

A semiconductor device according to the present invention produced in the above embodiment may have a planar structure other than the planar structure of FIG. 4 where in the BIP element portion, the base region (the external base region 335) has an extended portion perpendicular to the direction running from the collector region $37_2$ to the emitter region $38_2$ and extending outside these two regions. However, the base region of the BIP element with the structure as shown in FIG. 4 is preferable because the collector region $37_2$ is completely separated from the emitter region $38_2$. To obtain such a base region, when the island region $33_6$ of FIG. 3D is formed, the island region is shaped into the outward form of the BIP element of FIG. 4.

Figure 5A:
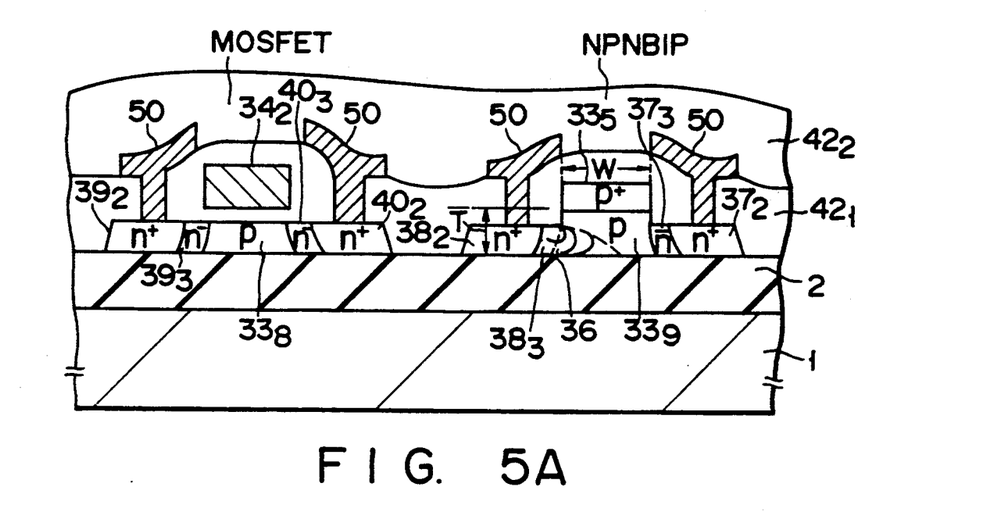
FIG. 5A is a sectional view taken along line a—a' of the FIG. 4 semiconductor device, FIG. 5B a sectional view taken along line b—b' of the FIG. 4 semiconductor device, and FIG. 5C a sectional view taken along line c—c' of the FIG. 4 semiconductor device.
Figure 5B:
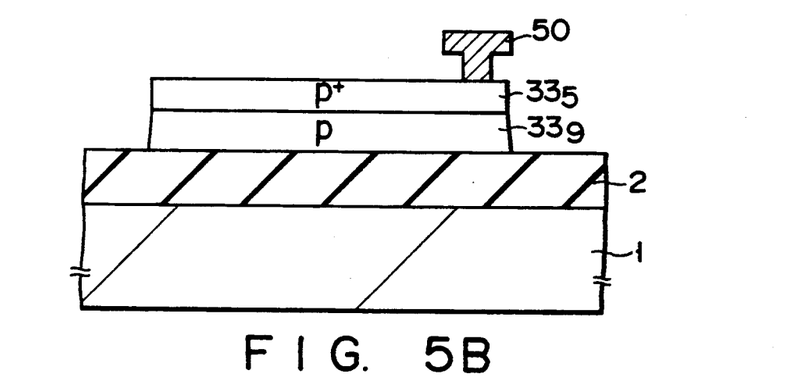
Figure 5C:
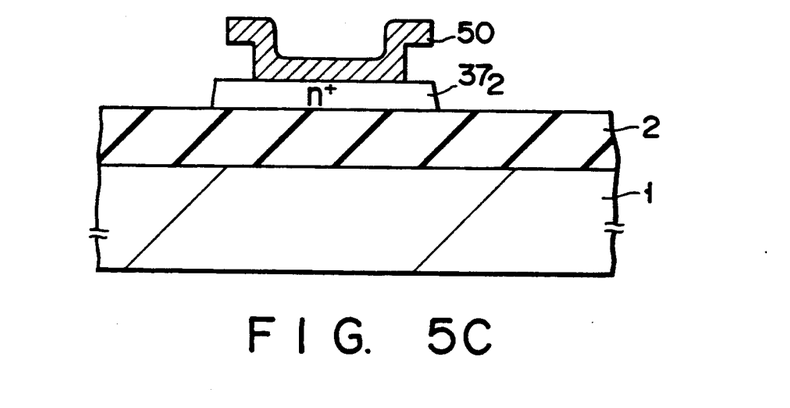

In a semiconductor device having a BIP element and MOSFET of the sectional structure of FIG. 5A, the channel-forming region $33_8$ of the MOSFET, the emitter region $38_2$, and collector region $37_2$ of the BIP element must all have the same film thickness ($t_0$) and it is desirable that they meet the following empirical formula (1):

$$t_0 \leq \sqrt{(\epsilon \phi_F / q N_A)} \quad (1)$$

where $\phi F$ is the Fermi level of semiconductor, q the charge of electron, $N_A$ the impurity concentration of semiconductor, and $\epsilon$ the permittivity.

It is desirable that the relationship between the thickness T of the internal base region $33_9$ and $t_0$ meets the following formula (2):

$$T \geq 2 \cdot t_0 \quad (2)$$

where $100 \text{Å} \leq t_0 \leq 3000 \text{Å}$

Since $t_0$ thinner than 100Å causes $h_{EF}$ to drop, a semiconductor element according to this invention is not suitable for LSI switching elements. When $t_0$ exceeds 3000Å, the characteristics of the element becomes more like those of transistors formed on bulk Si substrates, which prevents high speed operation characteristic of a SOI thin film.

It is desirable that the width W of the base region is $t_0$ or less.

In the aforementioned manufacturing method of semiconductor devices, the most notable feature is that the sidewall $SiO_2$ film $41_3$ is formed on the sidewalls of the external base region $33_5$ and the step portion of the internal base region $33_9$ as shown in FIG. 3G. Compared with the $SiO_2$ films $41_4$ and $41_5$ formed in the same manner, the $SiO_2$ film $41_3$ similarly protects part of the $n^-$ regions $37_1$, $38_1$, $39_1$, and $40_1$ from ion implantation of arsenic as shown in FIG. 3G, and then leaves the thin $n^-$ regions on both sides of the channel-forming region $33_8$ and at least the collector region $37_2$ side of the internal base region $33_9$. In addition to this, the $SiO_2$ film $41_3$ has a unique function of protecting the $p^+$-type region at the sidewall of the external base region $33_5$ and the p-type region of the sidewall at the step portion of the internal base region $33_9$ adjoining the sidewall of the external region $33_5$ on the $n^-$ region $37_1$ side. That is, the $SiO_2$ film $41_3$ can prevent the p-type region and $p^+$-type region from becoming $n^+$ regions due to ion implantation of arsenic. As a result, in the BIP element of FIG. 5A, a decrease in the withstand voltage between the internal base region $33_9$ and collector region $37_2$ can be prevented.

When the finally formed BIP element has a base extended region $43_5$ as shown in FIG. 4, it is desirable to prevent the formation of an $n^+$ region by forming a mask $43_{52}$ in the base extended region $43_5$ to protect the region $43_5$ from ion implantation of arsenic shown in FIG. 3G. This makes the separation of the collector region $37_2$ and emitter region $38_2$ more reliable.

In the above embodiment, the formation of the $n^-$-type regions $37_1$, $38_1$, $39_1$, and $40_1$ by ion implantation of phosphorus are not necessarily required. That is, the regions $37_2$, $38_2$, $39_2$, and $40_2$ ($n^+$-type) of FIG. 3G may be directly formed by implanting impurity ions via the island element regions $33_6$ and $33_7$ (p-type) of FIG. 3E. As described above, by forming the $n^+$-type region by ion implantation via the $SiO_2$ film after the formation of the $n^-$-type region, the thin $n^-$-type regions are formed on both sides of the p-type inner base region in the BIP element portion, and an LDD structure is constructed in the MOS element portion as shown in FIG. 5A. In the BIP element, however, it is preferable that the thin $n^-$-type region $38_3$ is also converted to p-type region together with forming the p-type inner base region by $B^+$-ion implantation, in view of enhancing emitter injection efficiency. In the BIP element, the generation of avalanche breakdown due to a high electric field at the junction between the base region $33_9$ and collector region $37_2$ is reduced, thereby preventing a decrease in the open-base emitter-collector withstand voltage ($V_{ECD}$) Thus, it is desirable to form the $n^-$-type region $37_3$ of FIG. 3G. The formation of such an $n^-$-type region between the base and collector regions has also been found in BIP elements of a vertical structure. In lateral BIP elements as formed in the embodiment, however, such an $n^-$-type region can be formed as thin as on the order of 1000 to 2000Å with the thickness controllability of nearly $\pm 10\%$, compared with vertical-structure BIP elements. Therefore, the thin $n^-$-type regions of BIP elements formed according to the present invention are very effective.

Figure 6A:
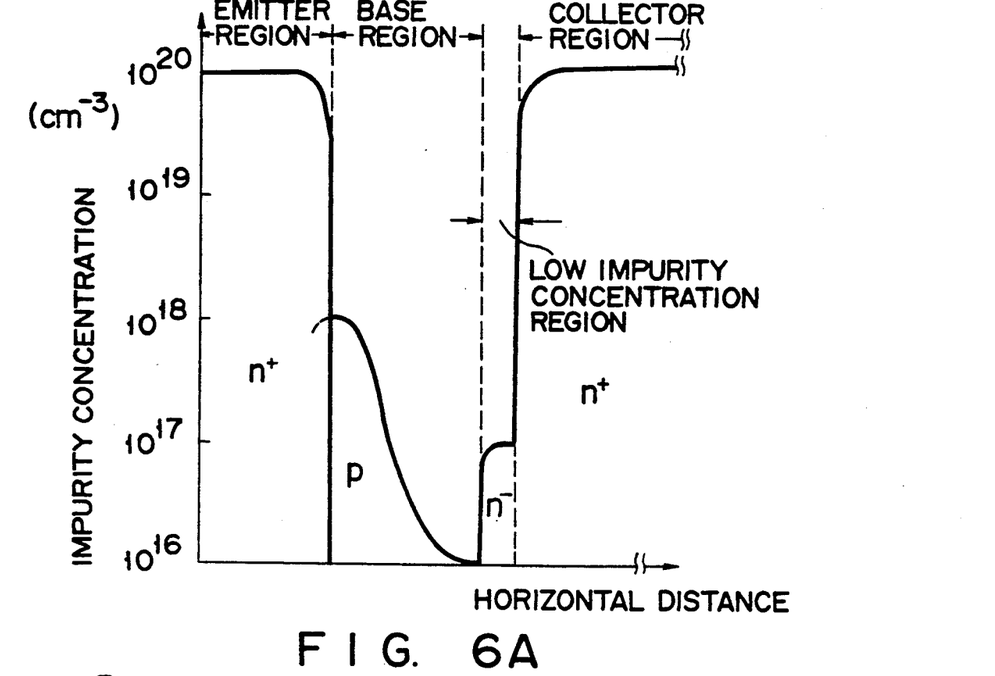
FIG. 6A is an impurity concentration profile of a cross section of a BIP element in a semiconductor device of the sectional structure in FIG. 5A.
Figure 6B:
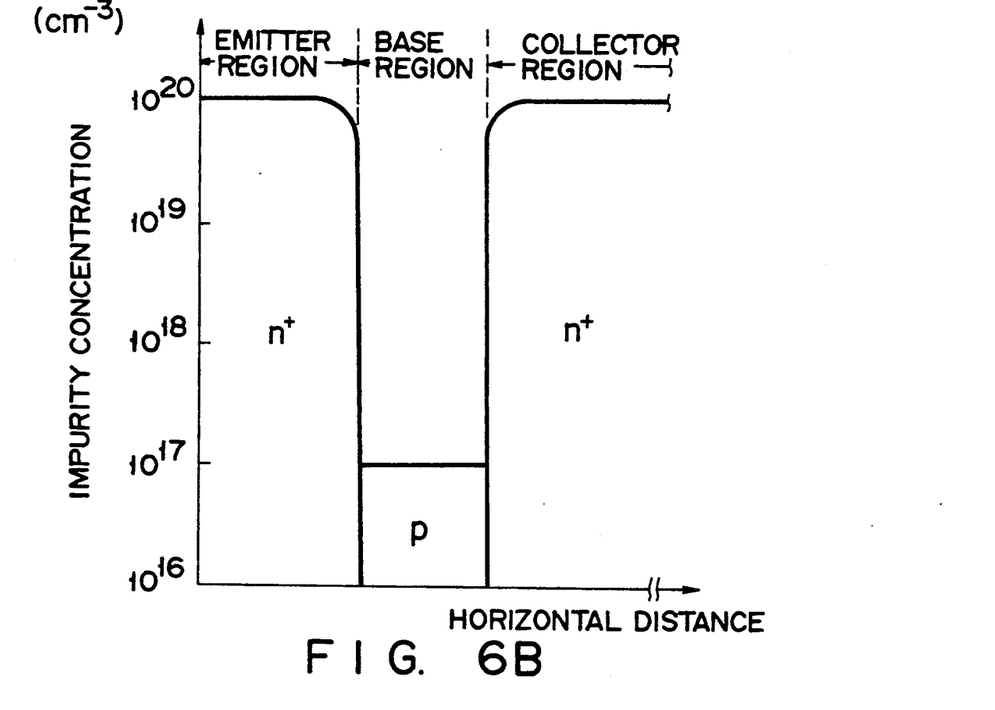
FIG. 6B an impurity concentration profile of a cross section of a BIP element produced by a conventional method.

FIG. 6A shows an impurity concentration profile of a BIP element cross section in a semiconductor device with a sectional structure similar to that of FIG. 5A in connection with the embodiment. In this semiconductor device, the thin $n^-$-type region does not intervene between the base region and the emitter region. For comparison's sake, FIG. 6B shows an impurity concentration profile of a cross section of a conventional BIP element having the sectional structure of FIG. 1D. As seen from these figures, in the BIP element of the embodiment, an n-type region of lower concentration than the collector region is formed between the base region and collector region. Additionally, in the BIP element of the embodiment, the impurity concentration in the base region is lower on the side of the collector region, decreasing gradually from the emitter region toward the collector region. This structure is formed by tilted ion implantation as shown in FIG. 3E.

Figure 6C:
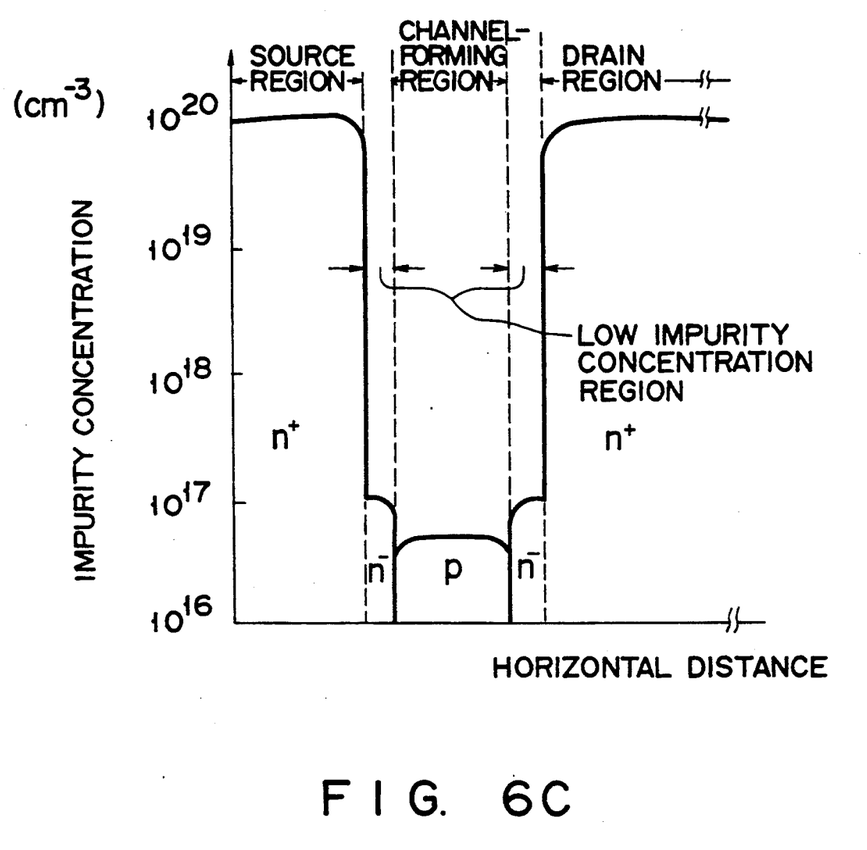
FIG. 6C an impurity concentration profile of a cross section of a MOSFET in a semiconductor device of the sectional structure in FIG. 5A.

FIG. 6C illustrates an impurity concentration profile of the MOSFET cross section formed together with the BIP element in the embodiment. As seen from the figure, an LDD structure is formed with a low-concentration impurity layer intervening between the source-drain region and channel- region.

As noted above, with the semiconductor device formed according to the above embodiment of the present invention, particularly the BIP element, the increased withstand voltage between the base region and collector region, the increased emitter-collector withstand voltage voltage, and the formation of the impurity concentration profile of the base region increase the transport factor of carriers in the base region, or shortens the transit time of carriers, thereby improving the high-frequency characteristics, such as cut-off frequency. Thus, a manufacturing method according to this invention enables the formation of lateral BIP elements that operate at a very high speed.

While in the embodiment, BIP elements and MOSFETs are formed simultaneously in a semiconductor element, only BIP elements of the same characteristics may be formed. With BIP elements only, power consumption increases significantly as more elements are integrated, which may result in a serious problem. Since heat dissipation is poor on the SOI film, this makes the power consumption problem much worse. Therefore, it is desirable to mix BIP elements and CMOSFETs on a substrate because the combination of them greatly reduces the overall power consumption on the SOI film.

In the manufacturing method of semiconductor devices according to the present invention, it is possible to form high performance BIP elements and CMOSFETs at the same time as described in the above embodiment, which provides a high performance BiCMOS structure not found in conventional semiconductor devices. In addition, to make use of the features of lateral BIP elements, two SOI film thicknesses are used to minimize the number of processes, which enables simultaneous formation with MOSFETs. An LDD structure of MOSFET and a low-concentration impurity region intervening between the base and collector regions in a BIP element can be formed at the same time, which improves not only the reliability of the MOSFET but also the withstand voltage of the BIP element without complicating the processes.

Figure 7:
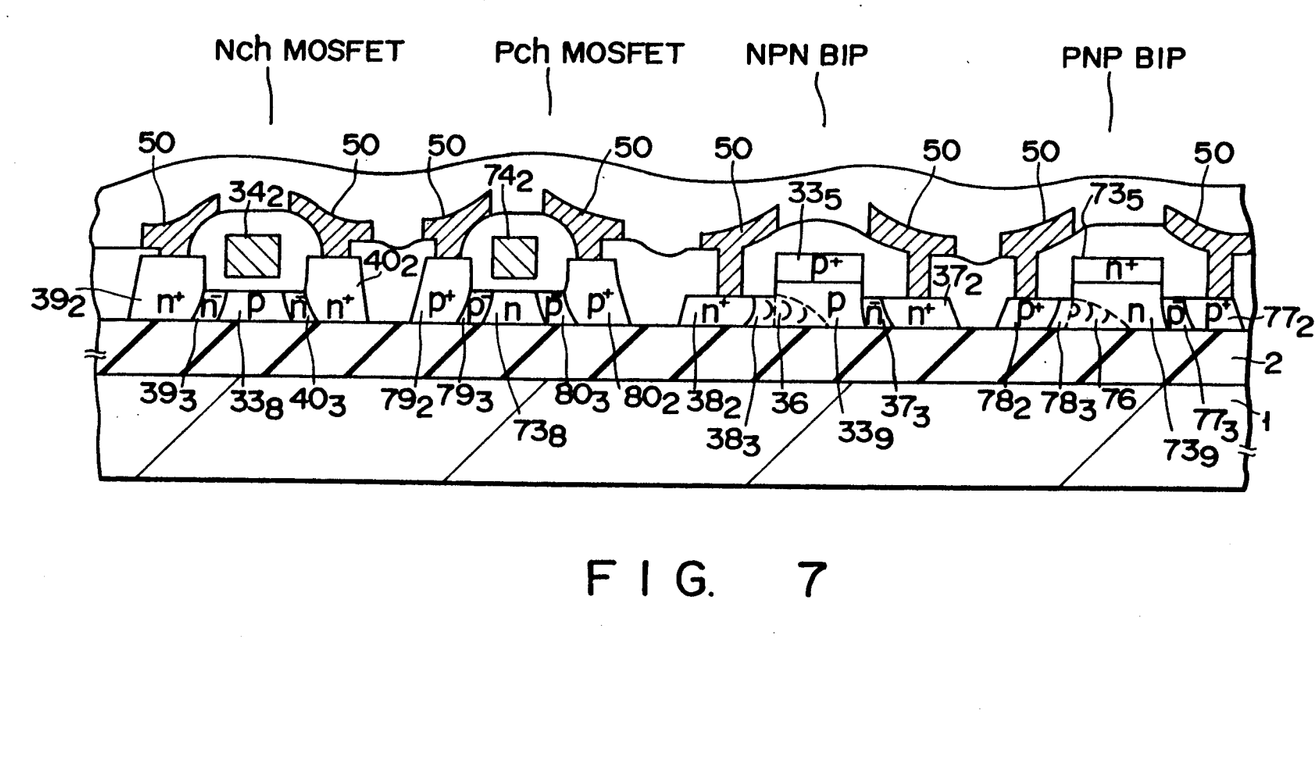
FIG. 7 is a sectional view of a semiconductor device of a complementary BiCMOS structure produced by a method according to the present invention.

FIG. 7 illustrates a sectional structure of a semiconductor device of a complementary BiCMOS structure formed according to a manufacturing method of the present invention. In the figure, the structures of Nch MOSFET and n-p-n BIP element are the same as those of FIG. 5A. The parts of a Pch MOSFET are indicated by the 70s and 80s replacing the reference numbers of the Nch MOSFET and the parts of a p-n-p BIP element are represented by the 70s replacing the reference numbers of the n-p-n BIP element. The difference between the BiCMOS structure of FIG. 7 and that of FIG. 5A is that the base region of the BIP element is left thicker than the emitter and collector regions, and at the same time, the source-drain region of the MOSFET is left thicker than the channel-forming region. This arrangement is obtained by selectively etching and thinning the predetermined region of the semiconductor layer in the same etching process.

As described above, in a manufacturing method according to the present invention, it is possible to simultaneously form Pch MOSFETs and p-n-p BIP elements in the same substrate as well as the aforementioned Nch MOSFETs and n-p-n BIP elements.

Elements formed together with BIP elements are not limited to MOSFETs and may be other types of FETs such as MIS-type FETs, Schottky junction FETs, or SIS-type FETs.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A manufacturing method of semiconductor devices, comprising:
   a first step of forming on the surface of an insulating substrate a semiconductor layer composed of a semiconductor layer of a first conductivity type on which a high-concentration semiconductor layer of the first conductivity type is formed;
   a second step of forming insulating film pattern that covers a prospective external base region of the high-concentration semiconductor layer of the first conductivity;
   a third step of leaving the high-concentration external base region of the first conductivity type just under the insulating film pattern by selectively etching the high-concentration semiconductor layer of the first conductivity type over the entire film thickness and then selectively etching the semiconductor layer of the first conductivity type over part of the film thickness with the insulating film pattern as mask, and at the same time, forming a thicker prospective internal base region just under the external base region and thinner portions on both sides of the prospective internal base region;
   a fourth step of forming an island element region by leaving only a prospective emitter region and prospective collector region that are located on both sides of the prospective internal base region and have steps between these prospective emitter and collector regions and the prospective internal base region through selective etching of the thinner portions of the semiconductor layer of the first conductivity type;
   a fifth step of forming a sidewall insulating film that covers at least the sidewalls on the prospective collector region side among sidewalls of the external base region and sidewalls at the steps of the prospective internal base region adjoining the sidewalls of the external base region; and
   a sixth step of forming the emitter region and collector region of a second conductivity type in the prospective emitter region and collector region, respectively, and the internal base region of the first conductivity type between the emitter and collector regions by highly doping impurities of the second conductivity type into the island element region through ion implantation perpendicular to the substrate with the insulating film pattern covering the external base region and the sidewall insulating film as blocking mask.

2. A manufacturing method of semiconductor devices according to claim 1, wherein in order to form low-concentration regions of the second conductivity type intervening between the internal base region of the first conductivity type and the collector region of the second conductivity type, after the fourth step, the low-concentration prospective collector region of the second conductivity type is formed in the prospective collector region, by lightly doping impurities of the second conductivity type into the island element region through ion implantation perpendicular to the substrate with the insulating film pattern covering the external base region as blocking mask, and then the fifth and sixth steps are performed.

3. A manufacturing method of semiconductor devices according to claim 1, wherein in order to make the impurity concentration in the internal base region of the first conductivity type higher on the emitter region side than the collector region side, after the fourth step, an insulating film is formed which covers the sidewalls of the external base region on the prospective collector region side and the prospective collector region adjoining the sidewall of the external base region, and with the insulating film as blocking mask, impurity ions of the first conductivity are diagonally implanted into the substrate at the step between the prospective emitter region and the prospective internal base region to give a concentration gradient to the prospective internal base region; and     in order to form low-concentration regions of the second conductivity type intervening between the internal base region of the first conductivity type and the collector region of the second conductivity type, the low-concentration prospective collector region of the second conductivity type is formed in the prospective collector region, by lightly doping impurities of the second conductivity type into the island element regions through ion implantation perpendicular to the substrate with the insulating film pattern covering the external base region as blocking mask, and then the fifth and sixth steps are performed.

4. A manufacturing method of semiconductor devices according to claim 1, wherein the insulating film pattern formed in the second step and the prospective internal base region formed in the third step have an extended portion that extends perpendicular to the direction running from the prospective emitter region to the prospective collector region formed in the fourth step and outside those two prospective regions;

in the fifth step, an extended portion insulating film to cover the tip portion of the extended portion is formed in addition to the sidewall insulating film; and     in the sixth step, the insulating film pattern covering the external base region, the sidewall insulating film, and the extended portion insulating film are used as blocking mask.

5. A manufacturing method of semiconductor devices, comprising:

a first step of forming on the surface of an insulating substrate a semiconductor layer composed of a semiconductor layer of a first conductivity type on which a high-concentration semiconductor layer of the first conductivity type is formed;

a second step of forming an insulating film pattern that covers a prospective external base region of the high-concentration semiconductor layer of the first conductivity;

a third step of leaving the high-concentration external base region of the first conductivity type just under the insulating film pattern by selectively etching the high-concentration semiconductor layer of the first conductivity type over the entire film thickness and then selectively etching the semiconductor layer of the first conductivity type over part of the film thickness with the insulating film pattern forming and at the same time, forming a thicker prospective internal base region just under the external base region and thinner portions outside the external base region;

a fourth step of forming a first island element region for a BIP element by leaving a prospective emitter region and prospective collector region that are located on both sides of the prospective internal base region and have steps between these prospective emitter and collector regions and the prospective internal base region through selective etching of the thinner portions of the semiconductor layer of the first conductivity type, and at the same time, forming a second island element region for an insulated-gate field effect transistor;

a fifth step of forming a gate electrode via a gate insulating film on a prospective channel-forming region in the second island element region for an insulated-gate field effect transistor;

a sixth step of forming a first sidewall insulating film that covers at least the sidewalls on the prospective collector region side among sidewalls of the external base region and sidewalls at the steps of the prospective internal base region adjoining the sidewalls of the external base region, and at the same time, forming a second sidewall insulating film covering the sidewalls of the gate electrode; and     a seventh step of forming the emitter region and collector region of a second conductivity type in the prospective emitter region and collector region, respectively, and the internal base region of the first conductivity type between the emitter and collector regions, and at the same time, forming a channel-forming region of the first conductivity type just under the gate electrode in the second island element region, and also forming the source region and drain region of the second conductivity type separated from each other on both sides of the channel-forming region, by highly doping impurities of the second conductivity type into the first and second island element regions through ion implantation perpendicular to the substrate with the insulating film pattern covering the external base region, the gate electrode, and the first and second sidewall insulating films as blocking mask.

6. A manufacturing method of semiconductor devices according to claim 5, wherein in order to form low-concentration regions of the second conductivity type intervening between the internal base region of the first conductivity type and the collector region of the second conductivity type in the first island region, and at the same time to form low-concentration regions of the second conductivity type intervening between the channel-forming region of the first conductivity type and the drain region of the second conductivity type and between the channel-forming region of the first conductivity type and the source region of the second conductivity type in the second island region, after the fifth step, the low-concentration prospective collector region of the second conductivity type is formed in the prospective collector region, and at the same time, the low-concentration prospective source region and prospective drain region of the second conductivity type are formed, separated from each other, on both sides of the prospective channel-forming region, by lightly doping impurities of the second conductivity type into the first and second island element regions through ion implantation perpendicular to the substrate with the insulating film pattern covering the external base region and the gate electrode as blocking mask, and then the sixth and seventh steps are performed.

7. A manufacturing method of semiconductor devices according to claim 5, wherein in order to make the impurity concentration in the internal base region of the first conductivity type higher on the emitter region side than the collector region side, after the fourth step, an insulating film is formed which covers the sidewalls of the external base region on the prospective collector region side and the prospective collector region adjoining the sidewall of the external base region in the first island element region, and at the same time, an insulating film covering the entire second island element region is formed, and with these insulating films as blocking mask, impurity ions of the first conductivity are diagonally implanted into the substrate at the step between the prospective emitter region and the prospective internal base region to give a concentration gradient to the prospective internal base region; and in order to form low-concentration regions of the second conductivity type intervening between the internal base region of the first conductivity type and the collector region of the second conductivity type in the first island region, and at the same time to form low-concentration regions of the second conductivity type intervening between the channel-forming region of the first conductivity type and the drain region of the second conductivity type and between the channel-forming region of the first conductivity type and the source region of the second conductivity type in the second island region, the low-concentration prospective collector region of the second conductivity type i formed in the prospective collector region, and at the same time, the low-concentration prospective source region and prospective drain source region of the second conductivity type are formed, separated from each other, on both sides of the prospective channel-forming region, by lightly doping impurities of the second conductivity type into the first and second island element regions through ion implantation perpendicular to the substrate with the insulating film pattern covering the external base region and the gate electrode as blocking mask, and then the fifth, sixth and seventh steps are performed.

8. A manufacturing method of semiconductor devices according to claim 5, wherein the insulating film pattern formed in the second step and the prospective internal base region formed in the third step have an extended portion that extends perpendicular to the direction running from the prospective emitter region to the prospective collector region formed in the fourth step and outside those two prospective regions;

in the sixth step, an extended portion insulating film to cover the tip portion of the extended portion is formed in addition to the first and second sidewall insulating films; and in the seventh step, the insulating film pattern covering the external base region, the gate electrode, the first and second sidewall insulating films, and the extended portion insulating film are used as blocking mask.

* * * * *